United States Patent
Zhong et al.

(10) Patent No.: US 10,359,488 B2
(45) Date of Patent: Jul. 23, 2019

(54) SIGNAL COMPONENT IDENTIFICATION USING MEDICAL IMAGING

(71) Applicant: Siemens Healthcare GmbH, Erlangen (DE)

(72) Inventors: Xiaodong Zhong, Lilburn, GA (US); Stephan Kannengiesser, Wuppertal (DE); Marcel Dominik Nickel, Herzogenaurach (DE); Brian M. Dale, Morrisville, NC (US); Berthold Kiefer, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 783 days.

(21) Appl. No.: 14/501,134

(22) Filed: Sep. 30, 2014

(65) Prior Publication Data

US 2015/0123658 A1 May 7, 2015

Related U.S. Application Data

(60) Provisional application No. 61/901,038, filed on Nov. 7, 2013.

(51) Int. Cl.
  *G01R 33/48* (2006.01)

(52) U.S. Cl.
  CPC .............................. *G01R 33/4828* (2013.01)

(58) Field of Classification Search
  CPC ................................................ G01R 33/4828
  USPC ........................................................ 324/309
  See application file for complete search history.

(56) References Cited

U.S. PATENT DOCUMENTS

| 7,176,683 B2* | 2/2007 | Reeder | G01R 33/4828 324/307 |
| 2009/0091324 A1* | 4/2009 | Sugiura | G01R 33/4828 324/309 |
| 2012/0008847 A1* | 1/2012 | Brendel | G01R 33/4828 382/131 |
| 2013/0214781 A1* | 8/2013 | Hernando | G01R 33/4828 324/309 |

OTHER PUBLICATIONS

Bydder et al., Relaxation effects in the quantification of fat using gradient echo imaging, 2008, Science Direct Magnetic Resonance Imaging, 26, 347-359.*
Hernando et al., Chemical Shift-Based Water/Fat Separation: A Comparison of Signal Models, 2010, Magn Reson Med., 64(3): 811-822.*
Yu, H., Reeder, S. B., Shimakawa, A., McKenzie, C. A. and Brittain, J. H. (2012), Robust multipoint water-fat separation using fat likelihood analysis. Magn Reson Med, 67: 1065-1076.

* cited by examiner

Primary Examiner — Susan S Lee (57) ABSTRACT

Disclosed herein is a framework for identifying signal components in image data. In accordance with one aspect, the framework receives multiple measured signal values corresponding to respective quantified signal components in image data. The framework determines at least one first measure of fit map of a signal model based on the measured signal values. The measured signal values may be swapped to generate swapped signal values. At least one second measure of fit map of the signal model may be determined based on the swapped signal values. The multiple signal components may then be identified by comparing the first and second measure of fit maps.

20 Claims, 3 Drawing Sheets

SIGNAL COMPONENT IDENTIFICATION USING MEDICAL IMAGING

CROSS-REFERENCE TO RELATED APPLICATION

This application claims the benefit of U.S. provisional application No. 61/901,038 filed on Nov. 7, 2013, the entire contents of which are incorporated herein by reference.

TECHNICAL FIELD

The present disclosure generally relates to diagnostic imaging and, more specifically, to automated or semi-automated systems and methods for identifying signal components in medical images.

BACKGROUND

The field of medical imaging has seen significant advances since the time X-Rays were first used to determine anatomical abnormalities. Medical imaging hardware has progressed from modern machines such as Medical Resonance Imaging (MRI) scanners, Computed Tomographic (CT) scanners, and Positron Emission Tomographic (PET) scanners, to multimodality imaging systems such as PET-CT and PET-MRI systems. Because of large amount of image data generated by such modern medical scanners, there has been and remains a need for developing image processing techniques that can automate some or all of the processes to determine the presence of anatomical abnormalities in scanned medical images.

Digital medical images are constructed using raw image data obtained from a scanner, for example, a CAT scanner, MRI, etc. Digital medical images are typically either a two-dimensional ("2-D") image made of pixel elements or a three-dimensional ("3-D") image made of volume elements ("voxels"). Such 2-D or 3-D images are processed using medical image recognition techniques to determine the presence of anatomical abnormalities such as cysts, tumors, polyps, etc. Given the amount of image data generated by any given image scan, it is preferable that an automatic technique should point out anatomical features in the selected regions of an image to a doctor for further diagnosis of any disease or condition.

Many diseases may be diagnosed by observing fat or iron deposition in tissues or organs, as compared to the normal status. For example, hepatic steatosis is a critical indication of various liver diseases, such as nonalcoholic fatty liver disease (NAFLD). Increased iron deposition is observed to be associated with chronic viral hepatitis, alcoholic liver disease and nonalcoholic steatohepatitis. Other clinical applications include diagnosis of bone marrow diseases, quantitative characterization of adrenal masses, and quantification of fat and iron deposition in the heart. Therefore, rapid and accurate evaluation of fat or iron deposition in tissues or organs is of great clinical interest.

Magnetic resonance imaging (MRI) has been used for this purpose. Dixon imaging is a well-established MRI method to measure fat. The method uses image acquisitions with distinct fat-water phase differences to separate fat and water images. To facilitate fat evaluation, a fat percentage (FP) map can be generated. The FP map is defined by the value of fat/(water+fat) for each pixel or voxel in the image. Sources of field inhomogeneity, T2/T2* and T1 effects, if not considered and corrected in the design of the method, may degrade measurement accuracy, because signal FP is actually measured instead of proton density FP.

Measuring iron is usually accomplished by measuring the tissue transverse relaxation values (T2 or T2*) or relaxation rates (R2=1/T2 or R2*=1/T2*) with MRI, because iron deposition has been demonstrated to be closely related to T2/T2* or R2/R2*. This is generally accomplished by acquiring multi-echo data and then performing a log-linear fitting. However, previous studies have shown that in the presence of fat, directly measuring T2/T2* or R2/R2* using this kind of approach can be problematic due to the influence of fat.

Some efforts have been made to quantify or separate water and fat in images acquired at two or more echo times. However, even when water and fat are successfully separated, the correct identification of water and fat for the two separated quantities is challenging. Typically, some prior knowledge of the scanned tissue or subject and some assumptions are needed to help identify the water and fat. For example, in some methods, a seed point needs to be determined by some algorithm to be a fat dominated pixel or voxel, so that subsequent steps can use the information of this seed point to identify water and fat voxels. If the seed point selection algorithm fails (i.e., a water dominated voxel is selected), then the resultant water and fat images will be erroneously swapped. As another example, most methods assume phase error due to field inhomogeneity (i.e., field map) is smooth, and the identification of water and fat is based on such key assumption. However, if the phase error is not smooth, such as in areas with severe susceptibilities, then this would lead to water and fat swap in those areas.

SUMMARY

The present disclosure relates to a framework for identifying signal components in image data. In accordance with one aspect, the framework receives multiple measured signal values corresponding to respective quantified signal components in image data. The framework determines at least one first measure of fit map of a signal model based on the measured signal values. The measured signal values may be swapped to generate swapped signal values. At least one second measure of fit map of the signal model may be determined based on the swapped signal values. The multiple signal components may then be identified by comparing the first and second measure of fit maps.

This summary is provided to introduce a selection of concepts in a simplified form that are further described below in the following detailed description. It is not intended to identify features or essential features of the claimed subject matter, nor is it intended that it be used to limit the scope of the claimed subject matter. Furthermore, the claimed subject matter is not limited to implementations that solve any or all disadvantages noted in any part of this disclosure.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings. Furthermore, it should be noted that the same numbers are used throughout the drawings to reference like elements and features.

DETAILED DESCRIPTION

In the following description, numerous specific details are set forth such as examples of specific components, devices, methods, etc., in order to provide a thorough understanding of embodiments of the present invention. It will be apparent, however, to one skilled in the art that these specific details need not be employed to practice embodiments of the present invention. In other instances, well-known materials or methods have not been described in detail in order to avoid unnecessarily obscuring embodiments of the present invention. While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

The term "x-ray image" as used herein may mean a visible x-ray image (e.g., displayed on a video screen) or a digital representation of an x-ray image (e.g., a file corresponding to the pixel output of an x-ray detector). The term "in-treatment x-ray image" as used herein may refer to images captured at any point in time during a treatment delivery phase of a radiosurgery or radiotherapy procedure, which may include times when the radiation source is either on or off. From time to time, for convenience of description, MRI imaging data may be used herein as an exemplary imaging modality. It will be appreciated, however, that data from any type of imaging modality including, but not limited to, X-Ray radiographs, MRI, CT, PET (positron emission tomography), PET-CT, SPECT, SPECT-CT, MR-PET, 3D ultrasound images or the like may also be used in various embodiments of the invention.

Unless stated otherwise as apparent from the following discussion, it will be appreciated that terms such as "segmenting," "generating," "registering," "determining," "aligning," "positioning," "processing," "computing," "selecting," "estimating," "detecting," "tracking" or the like may refer to the actions and processes of a computer system, or similar electronic computing device, that manipulates and transforms data represented as physical (e.g., electronic) quantities within the computer system's registers and memories into other data similarly represented as physical quantities within the computer system's memories or registers or other such information storage, transmission or display devices. Embodiments of the methods described herein may be implemented using computer software. If written in a programming language conforming to a recognized standard, sequences of instructions designed to implement the methods can be compiled for execution on a variety of hardware platforms and for interface to a variety of operating systems. In addition, embodiments of the present invention are not described with reference to any particular programming language. It will be appreciated that a variety of programming languages may be used to implement embodiments of the present invention.

As used herein, the term "image" refers to multi-dimensional data composed of discrete image elements (e.g., pixels for 2-D images and voxels for 3-D images). The image may be, for example, a medical image of a subject collected by computed tomography, magnetic resonance imaging, ultrasound, or any other medical imaging system known to one of skill in the art. The image may also be provided from non-medical contexts, such as, for example, remote sensing systems, electron microscopy, etc. The methods of the inventions can be applied to images of any dimension, e.g., a 2-D picture or a 3-D volume. For a 2- or 3-dimensional image, the domain of the image is typically a 2- or 3-dimensional rectangular array, wherein each pixel or voxel can be addressed with reference to a set of two or three mutually orthogonal axes. The terms "digital" and "digitized" as used herein will refer to images or volumes, as appropriate, in a digital or digitized format acquired via a digital acquisition system or via conversion from an analog image.

A framework for automatically evaluating medical images is described herein. In accordance with one aspect, the framework identifies separated water and fat signals represented in medical images to prevent water and fat swapping errors. The framework uses a measure of fit (e.g., goodness of fit) to automatically or semi-automatically evaluate separated water and fat signals to determine if the signals are correctly identified. The measure of fit may serve as a single overall measure that is used to identify fat and water.

Known methods usually attempt to solve the water and fat swap problem by targeting the fat separation or quantification algorithm itself, which is often challenging due to imperfection of possible assumptions in the algorithm. The present framework seeks to solve the water and fat swapping problem primarily after the fat separation or quantification algorithm is performed, which can avoid problems caused by imperfect assumptions in the fat separation or quantification algorithm. However, if necessary, it can be used in conjunction with the fat separation or quantification algorithm too.

In addition, the present framework is implemented by closed-form equations and a non-iterative process, and is therefore more computationally efficient than iterative methods, such as those described by Yu et al., "Robust multipoint water-fat separation using fat likelihood analysis" Magnetic Resonance in Medicine 67.4 (2012): 1065-1076 ("Yu"), which is herein incorporated by reference. For example, Yu describes an iterative Fat Likelihood Analysis to separate water and fat. More particularly, Yu uses a fat likelihood map to indicate if a pixel is likely to be water-dominant or fat-dominant by comparing the fitting residuals of two different signal models. Two fat spectra with different spectral peaks are used for these two signal models, wherein one spectrum has only one fat spectral peak and the other spectrum has multiple fat spectral peaks. In contrast, the present framework uses only one fat spectrum with multiple fat spectral peaks instead of two fat spectra. In addition, an overall measure of fit factor may be used as a single comparison measure to identify fat and water. These exemplary advantages and features will be described in more details in the following description.

For illustration purposes, the present framework may be described in the context of identifying water and fat signals in image data. However, it should be appreciated that the present framework may also be applied to identify other types of signal components in image data.

Figure 1:
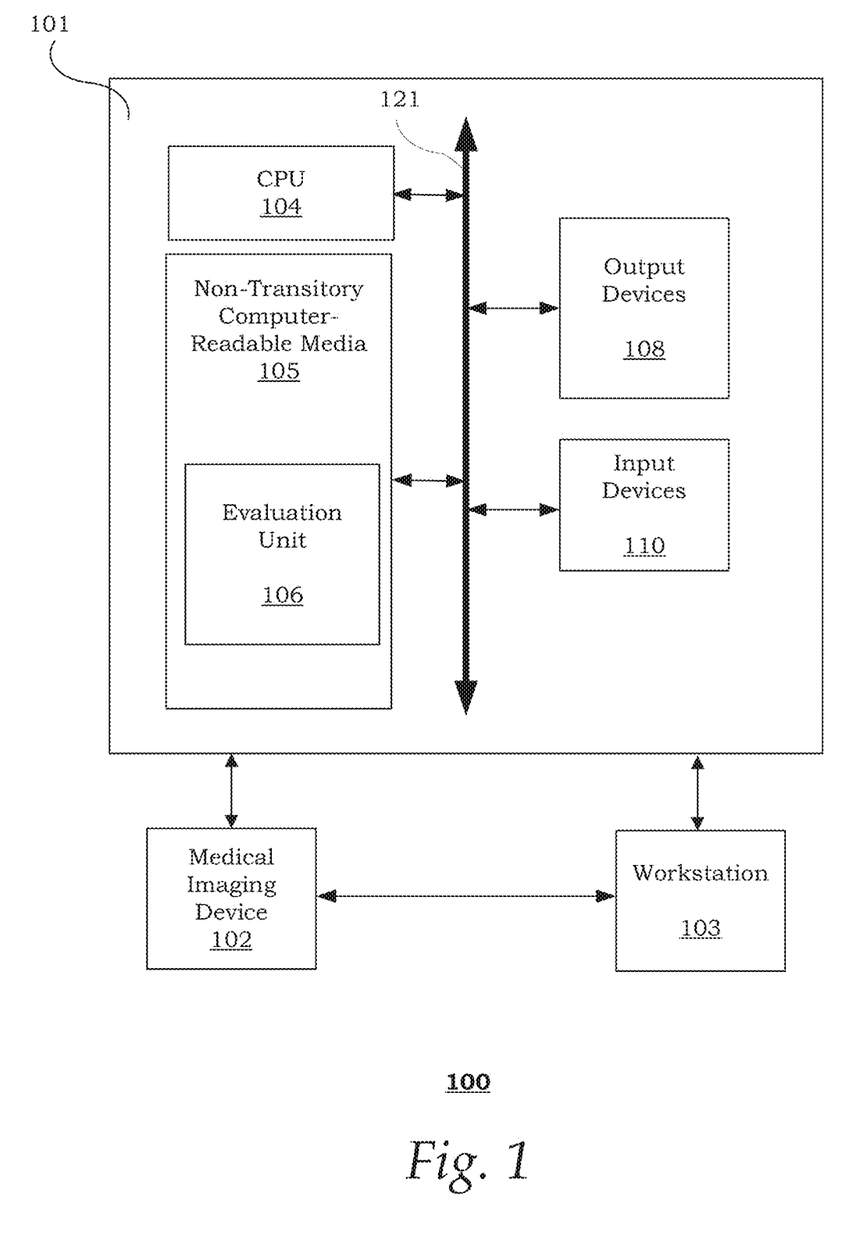
FIG. 1 is a block diagram illustrating an exemplary imaging system 100.

FIG. 1 is a block diagram illustrating an exemplary imaging system 100. The imaging system 100 includes a computer system 101 for implementing the framework as described herein. The computer system 101 may further be connected to a medical imaging device 102 and a workstation 103, over a wired or wireless network. Medical imaging device 102 may be a radiology scanner, such as a magnetic resonance (MR) scanner.

Computer system 101 may be a desktop personal computer, a portable laptop computer, another portable device, a mini-computer, a mainframe computer, a server, a storage system, a dedicated digital appliance, or another device having a storage sub-system configured to store a collection of digital data items. In one implementation, computer system 101 comprises a processor or central processing unit (CPU) 104 coupled to one or more non-transitory computer-readable media 105 (e.g., computer storage or memory), output devices 108 (e.g., monitor, display, printer, etc.) and various input devices 110 (e.g., mouse, keyboard, touch pad, voice recognition module, etc.) via an input-output interface 121. Computer system 101 may further include support circuits such as a cache, a power supply, clock circuits and a communications bus. Even further, computer system 101 may be provided with a graphics controller chip, such as a graphics processing unit (GPU) that supports high performance graphics functions.

It is to be understood that the present technology may be implemented in various forms of hardware, software, firmware, special purpose processors, or a combination thereof. In one implementation, the techniques described herein are implemented by evaluation unit 106. Evaluation unit 106 may include computer-readable program code tangibly embodied in non-transitory computer-readable media 105. Non-transitory computer-readable media 105 may include random access memory (RAM), read only memory (ROM), magnetic floppy disk, flash memory, and other types of memories, or a combination thereof. The computer-readable program code is executed by CPU 104 to control and/or process image data from medical imaging device 102.

As such, the computer system 101 is a general-purpose computer system that becomes a specific-purpose computer system when executing the computer readable program code. The computer-readable program code is not intended to be limited to any particular programming language and implementation thereof. It will be appreciated that a variety of programming languages and coding thereof may be used to implement the teachings of the disclosure contained herein. Computer system 101 may also include an operating system and microinstruction code. The various techniques described herein may be implemented either as part of the microinstruction code or as part of an application program or software product, or a combination thereof, which is executed via the operating system. Various other peripheral devices, such as additional data storage devices and printing devices, may be connected to the computer system 101.

The workstation 103 may include a computer and appropriate peripherals, such as a keyboard and display, and can be operated in conjunction with the entire system 100. For example, workstation 103 may communicate with medical imaging device 102 so that the image data collected by medical imaging device 102 can be rendered at the workstation 103 and viewed on the display. The workstation 103 may include a user interface that allows a radiologist or any other skilled user (e.g., physician, technician, operator, scientist, etc.), to manipulate the image data. Further, the workstation 103 may communicate directly with computer system 101 to display processed image data. For example, a radiologist can interactively manipulate the displayed representation of the processed image data and view it from various viewpoints and in various reading modes.

Figure 2:
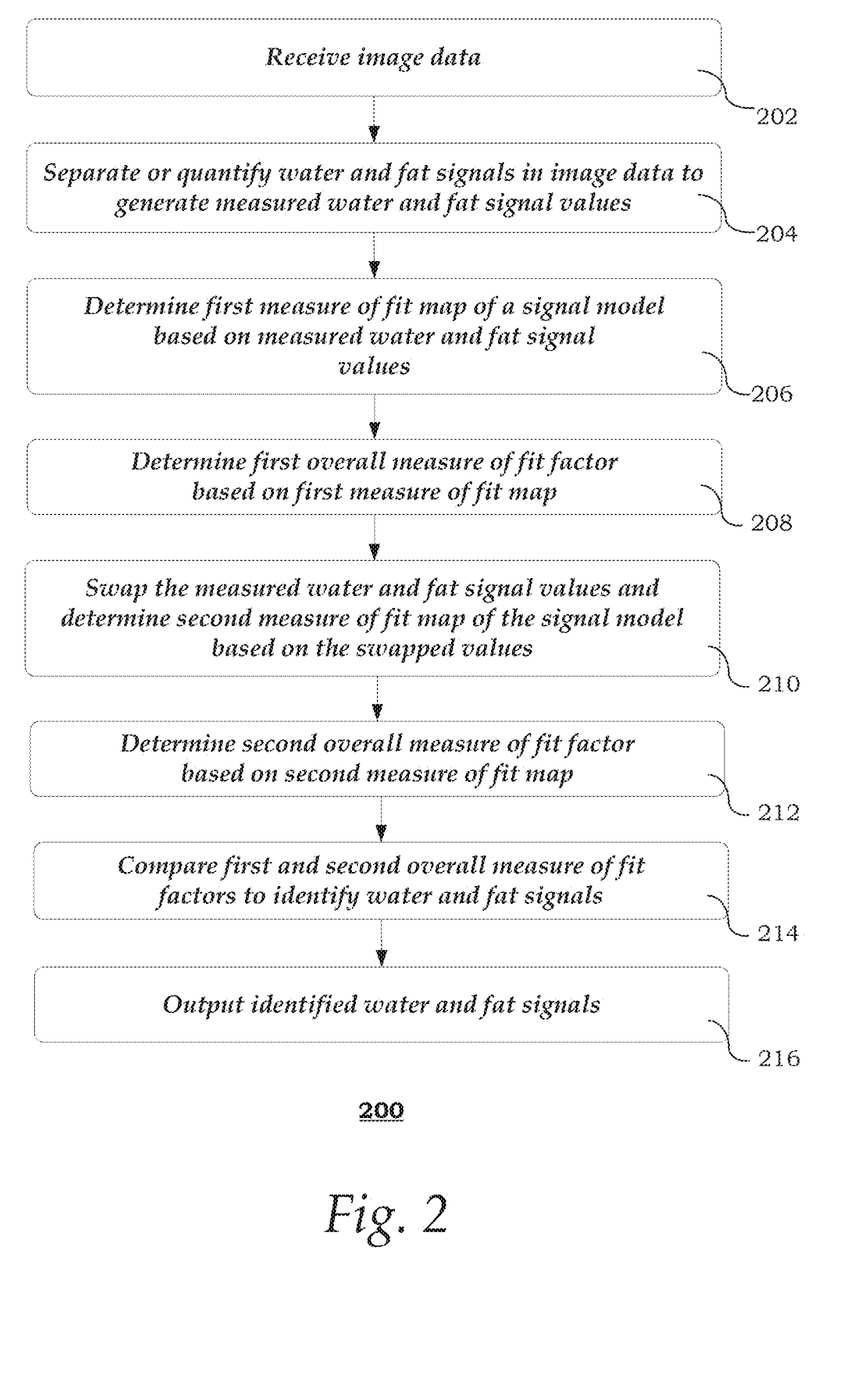
FIG. 2 shows an exemplary method of identifying fat and water in medical image data.

FIG. 2 shows an exemplary method 200 of identifying fat and water in medical image data. It should be noted that the steps of the method 200 may be performed in the order shown or a different order. Furthermore, different, additional or fewer steps may be implemented. Even further, the method 200 may be implemented with the system 100 of FIG. 1, a different system, or a combination thereof.

At 202, evaluation unit 106 receives image data. In some implementations, the image data is acquired by MRI. MR image data may be acquired by sampling echo signals that are formed at a plurality of different echoes times (e.g., two, three or more different echoes). For example, a 32-channel phased-array body coil may be used to acquire MR image data while directing the MRI system to perform a three-dimensional multi-echo spoiled gradient-echo pulse sequence. Other methods of acquiring MR image data are also possible. For instance, other type of sequence types, such as a balanced steady state free precession (SSFP or trueFISP) sequence type, or a turbo spin echo (TSE) sequence type, may be performed to acquire the MR image data.

At 204, evaluation unit 106 separates and/or quantifies water and fat signals in the received image data to generate measured water and fat signal values ($\tilde{M}_{w1}$ and $\tilde{M}_{f1}$ respectively). In some implementations, the measured water and fat signal values are magnitudes. Alternatively, complex values of the water and fat signals may also be quantified. Fat and water images are reconstructed from the received image data. For example, Dixon techniques with multi-peak spectral modeling and multiple echoes (echo number is equal to or greater than 2) may be utilized on complex-valued image data in order to reconstruct the fat and water images. Other similar methods of image reconstruction are also possible. For example, dual-echo flexible-TE method provides a reliable approach to separate water and fat in two-echo image data. See, for example, Eggers H, Brendel B, Duijndam A, Herigault G., "Dual-Echo Dixon Imaging with Flexible Choice of Echo Times," Mag Reson Med 2011; 65:96-107, which is herein incorporated by reference.

Measured water and fat signal values ($\tilde{M}_{w1}$ and $\tilde{M}_{f1}$ respectively) may further be quantified. One exemplary category of methods for quantifying water and fat are IDEAL-based methods (Iterative Decomposition of water and fat with Echo Asymmetry and Least-squares estimation). See, for example, U.S. Pat. No. 7,176,683 by Reeder et al., which is herein incorporated by reference. IDEAL-based methods employ an iterative least squares decomposition approach to estimate the separate water and fat signal components in multiple images at 3 or more different echo times. Another exemplary method solves unknown variables in non-linear equations using a non-linear fitting method. For example, the Levenberg-Marquardt algorithm, also known as the damped least-squares method, may be used. See, for example, Levenberg K., "A Method for the Solution of Certain Non-Linear Problems in Least Squares," Quarterly of Applied Mathematics 1944; 2:164-168, which is herein incorporated by reference.

These algorithms generally face the intrinsic challenge of water-fat ambiguity, which arises due to the fact that the signal behavior of fat and water may appear identical under certain circumstances. Such ambiguities often result in water-fat swaps, in which a voxel containing, for example, water is mischaracterized as containing fat. The present framework advantageously identifies the water and fat images by using measures of fit to evaluate how well the water and fat signals are quantified, as will be discussed in the following steps.

At 206, evaluation unit 106 determines a first measure of fit map of a signal model based on the measured water and fat signal values ($\tilde{M}_{w1}$ and $\tilde{M}_{f1}$ respectively). Such determination is based on the assumption that the measured water and fat signals are correctly identified (i.e., no mischaracterization).

The signal model is generally a theoretical model that formalizes relationships between variables to quantify expected signal values under the model. In some implementations, the signal model is determined based on the assumption that low flip angles are used for acquiring the image data, so that the T1 effect can be reasonably ignored in the signal model. For the n-th echo time ($TE_n$) the signal value of the acquired MR signal ($S_n$) may be expected to have the relationship as described by the following signal model equation:

$$S_n = (M_w \cdot e^{-R_{2w}^* TE_n} + c_n M_f e^{-R_{2f}^* TE_n}) E_n \quad (1)$$

In equation (1), the unknown variables include: $M_w$ and $M_f$ (water and fat signal values, respectively, which are proportional to the magnetization or proton density of those tissue types); $R_{2w}^*$ and $R_{2f}^*$ (transverse relaxation rates of water and fat, respectively); and $E_n$ (a complex phasor with unit-length magnitude, containing any phase errors due to systematic imperfection, such as off-resonance, eddy-currents, and gradient delays).

Note that $c_n$ is the complex coefficient at $TE_n$ due to the difference of fat and water in the spectrum, and may be calculated based on any fat spectral model, including the simplest model with a single peak at −3.3 ppm, depending on the body region of interest. Specifically, the complex coefficient $c_n$ is calculated as:

$$c_n = \sum_{i=1}^{m} w_i e^{j(2\pi \Delta f_i TE_n)} \quad (2)$$

where m is the number of the fat spectral peaks in the model, $w_i$ and $\Delta f_i$ are fat peak weighting factors and the resonance frequency offsets relative to the water peak on the spectrum. The sum of the weighting factors $w_i$ may be normalized to 1.0. $c_n$ may be calculated using a seven-peak fat spectrum.

Among the unknown variables, $E_n$ is generally not of interest in clinical applications. Therefore, it is not necessary to solve $E_n$. Taking magnitude on both sides to remove $E_n$ from the signal model equation (1), the following results:

$$|S_n| = |(M_w \cdot e^{-R_{2w}^* TE_n} + c_n M_f e^{-R_{2f}^* TE_n})| \quad (3)$$

Accordingly, equation (3) now has four unknown variables, $M_w$, $M_f$, $R_{2w}^*$ and $R_{2f}^*$, which can be solved using acquisitions with echoes equal to or greater than 4.

In some situations, in order to reduce the complexity of the equation, the signal model can be further simplified by replacing the $R_{2w}^*$ and $R_{2f}^*$ with a single effective $R_2^*$ for the water-fat mixture. And the signal model equations (1) and (3) become, respectively:

$$S_n = (M_w + c_n M_f) E_n \cdot e^{-R_{2eff}^* TE_n} \quad (4)$$

$$|S_n| = |(M_w + c_n M_f) \cdot e^{-R_{2eff}^* TE_n}| \quad (5)$$

Equation (5) reduces the number of unknown variables to three: $M_w$, $M_f$, and $R_{2eff}^*$, which can be determined using acquisitions with echoes equal to or greater than 3.

If only two echoes are acquired, the acquired image data may not be sufficient to quantify fat and water. However, water and fat can at least be separated. The water-fat separation is usually based on signal equations below, which are simplified from equations (4) and (5).

$$S_n = (M_w + c_n M_f) E_n \quad (6)$$

$$|S_n| = |(M_w + c_n M_f)| \quad (7)$$

In accordance with some implementations, the first measure of fit map includes a goodness of fit map. However, it should be appreciated that any other type of measure of fit that compares the theoretical signal expected under the signal model to the measured signal values ($\tilde{M}_{w1}$ and $\tilde{M}_{f1}$), in either magnitude or complex data, can be used. The goodness of fit map may be two-dimensional, three-dimensional, or any other number of dimensions. The goodness of fit map may be used to evaluate how well the water and fat signals in the received image data are separated or quantified in the previous step 204. For example, in the water-fat separation scenario, equation (7) may be used to derive a goodness of fit map that contains the normalized error for each pixel or voxel. More particularly, the value of each pixel or voxel, g, in an exemplary goodness of fit map may be calculated using the following:

$$g = \frac{||S_n| - |(\tilde{M}_w + c_n \tilde{M}_f)||}{|S_n|} \quad (8)$$

where $\tilde{M}_w$ and $\tilde{M}_f$ are the measured water and fat signal values, respectively, and $S_n$ is signal value of the acquired MR signal. The value of g may be equal to or greater than 0. Although exceptions exist, in general, the smaller g is, the more accurately the calculated $\tilde{M}_w$ and $\tilde{M}_f$ match the expected true values.

To determine the goodness of fit map, evaluation unit 106 may assign the measured water signal value $\tilde{M}_{w1}$ to the calculated water signal value $\tilde{M}_{w2}$ for determining the goodness of fit map. Additionally, evaluation unit 106 may assign the measured fat signal value $\tilde{M}_{f1}$ to the calculated fat signal value $\tilde{M}_{f2}$ to be used for determining the goodness of fit map. The goodness of fit map may then be determined using, for example, equation (8).

Although the exemplary goodness of fit map equation (8) is based on equation (7), it should be noted that similar equations may also be derived to calculate g. For example, similar equations may be derived based on different signal model equations, such as equation (3) or (5), depending on the specific algorithm to quantify the water and fat.

$$g = \frac{||S_n| - |(\tilde{M}_w \cdot e^{-\tilde{R}_{2w}^* TE_n} + c_n \tilde{M}_f \cdot e^{-\tilde{R}_{2f}^* TE_n})||}{|S_n|} \quad (10)$$

$$g = \frac{||S_n| - |(\tilde{M}_w + c_n \tilde{M}_f) \cdot e^{-\tilde{R}_{2eff}^* TE_n}||}{|S_n|} \quad (11)$$

where $\tilde{R}_{2w}^*$, $\tilde{R}_{2f}^*$ and $\tilde{R}_{2eff}^*$ are the measured water, fat and effective $R_2^*$, respectively.

It should be appreciated that any other measures of fit may also be used to compare the signal model to the observed or measured data. In addition, the aforementioned exemplary equations are based on the Euclidean norm. However, alternative forms, such as p-norm, norm of other formats or functions, may also be used. Further, the exemplary equations use magnitude operations. However, for a complex signal model, magnitude operations on observed data and signal model are not necessary, and other complex operations may also be used.

At 208, evaluation unit 106 determines a first overall measure of fit factor ($G_2$) based on the first measure of fit map. In some implementations, the first overall measure of fit factor ($G_2$) includes an overall goodness of fit factor. The overall goodness of fit factor summarizes the values of all pixels or voxels in the goodness of fit map, and may be determined as follows:

$$G = \sum_{e=1}^{N_{echo}} \sum_{v=1}^{N_{voxel}} g_{ve} \qquad (9)$$

Equation (9) uses the sum of all pixel or voxel values as an example. However, it should be appreciated that G may also be calculated using other functions as well.

At 210, evaluation unit 106 swaps the measured water and fat signal values and determines a second measure of fit map based on the swapped signal values. Such determination is based on the assumption that the water and fat signals are incorrectly identified in step 204 (i.e., water signal is mischaracterized as fat signal, and fat signal is mischaracterized as water signal). Therefore, the water signal value used to calculate the second measure of fit map may be set to the fat signal value generated by step 204, and the fat signal value used to calculate the second measure of fit map may be set to the water signal value generated by step 204.

In some implementations, the second measure of fit map includes a goodness of fit map, such as the one defined by equation (8). However, it should be appreciated that any other type of measure of fit that compares the signal model to the measured signal values can be used. To determine the goodness of fit map, evaluation unit 106 may assign the measured water signal value $\tilde{M}_{w1}$ to the calculated fat signal value $\tilde{M}_{f3}$ for determining the goodness of fit map. Additionally, evaluation unit 106 may assign the measured fat signal value $\tilde{M}_{f1}$ to the calculated water signal value $\tilde{M}_{f3}$ to be used for determining the goodness of fit map. The goodness of fit map may then be determined using, for example, equation (8).

At 212, evaluation unit 106 determines a second overall measure of fit factor ($G_3$) based on the second measure of fit map. In some implementations, the second overall measure of fit factor ($G_3$) includes an overall goodness of fit factor. The overall goodness of fit factor may be determined using, for example, equation (9).

At 214, evaluation unit 106 compares the first and second overall measure of fit factors ($G_2$ and $G_3$) to identify water and fat signals. For example, the smaller the overall goodness of fit factor is, the more accurately the calculated water signal value ($\tilde{M}_{w2}$ or $\tilde{M}_{w3}$) and calculated fat signal value ($\tilde{M}_{f2}$ or $\tilde{M}_{f3}$) matches the expected true values. Accordingly, if $G_2$ is less than or equal to $G_3$, then the true water signal value $\tilde{M}_{w4}$ is identified as $\tilde{M}_{w1}$, and the true fat signal value $\tilde{M}_{f4}$ is identified as $\tilde{M}_{f1}$. If $G_2$ is greater than $G_3$, then the true water signal value $\tilde{M}_{w4}$ is identified as $\tilde{M}_{f1}$, and the true fat signal value $\tilde{M}_{f4}$ is identified as $\tilde{M}_{w1}$.

Figure 3:
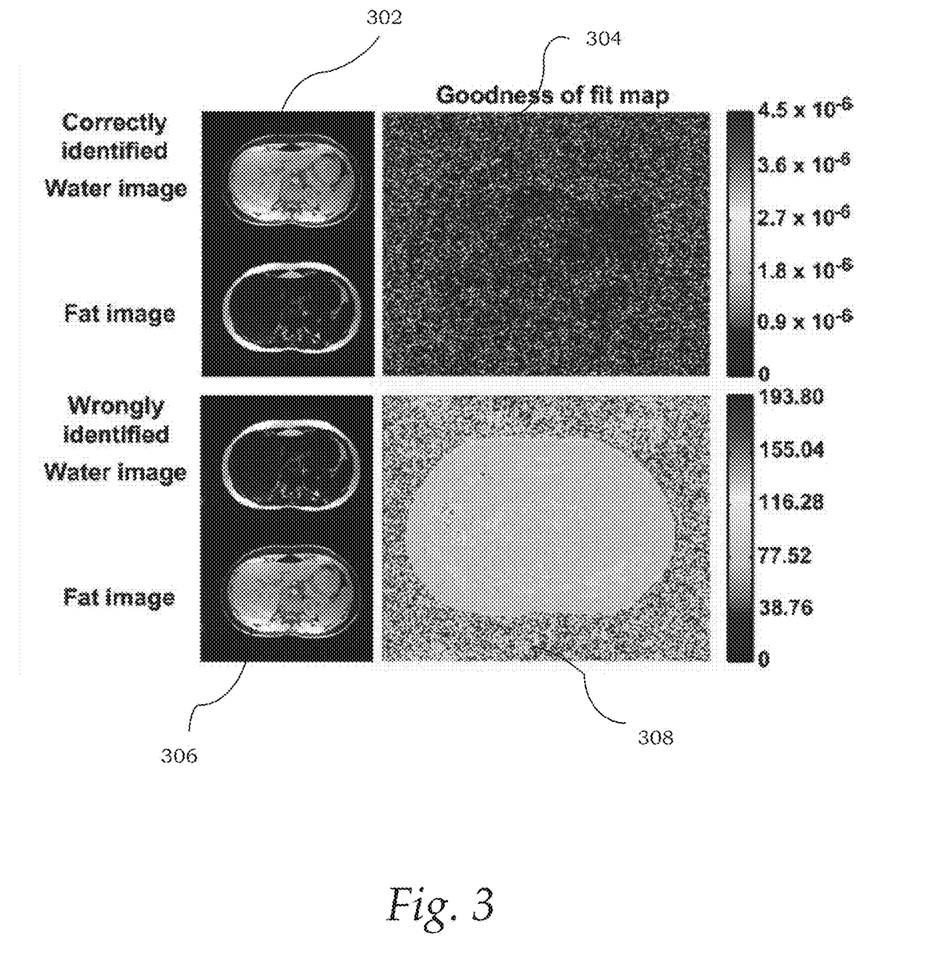
FIG. 3 shows exemplary results of water-fat identification.

At 216, evaluation unit 106 outputs resultant identified water and fat signals (or true water and fat signal values). FIG. 3 shows exemplary results of the water-fat identification. In the example shown, $G_2$ was equal to 0.32, and $G_3$ was equal to $3.11 \times 10^6$. Correctly identified water and fat images 302 correspond to a goodness of fit map 304 with low goodness of fit values. In contrast, wrongly identified water and fat images 306 correspond to a goodness of fit map 308 with higher goodness of fit values.

Although the present framework is described as identifying complete water and fat images, it is also possible to apply the same concept to evaluate the measure of fit for different combinations of water and fat, so as to locally identify the water and fat correctly pixel-by-pixel or voxel-by-voxel. More particularly, many methods to separate water and fat signals require at some point a determination of whether the calculated quantity in a pixel is water or fat. The present framework may be integrated into such determination. For example, a region growing-based framework may be used to determine whether the solved two quantities belong to water or fat. Such region growing-based framework may use the phase information of the original echo data (after phase correction) to group the quantity which has a closer phase value to the existing known water or fat pixels. If the phase information is erroneous due to, for example, field inhomogeneity or eddy current, then this framework may fail and partial water and fat swapping can happen. If the measure of fit framework is integrated into this process, such that not only the phase information is used in the region growing algorithm, but also the magnitude information, stability of this process may be improved.

While the present invention has been described in detail with reference to exemplary embodiments, those skilled in the art will appreciate that various modifications and substitutions can be made thereto without departing from the spirit and scope of the invention as set forth in the appended claims. For example, elements and/or features of different exemplary embodiments may be combined with each other and/or substituted for each other within the scope of this disclosure and appended claims.

The invention claimed is:

1. A system comprising:
   a work station, and
   a computer system comprising non-transitory computer-readable medium embodying a program of instructions executable by machine to perform steps comprising:
   quantifying water and fat signals in magnetic resonance (MR) image data acquired by a radiology scanner to generate measured water and fat signal magnitudes;
   determining a first measure of fit map of a signal model based on the measured water and fat signal magnitudes;
   determining a first overall measure of fit factor based on the first measure of fit map;
   swapping the measured water and fat signal magnitudes to generate swapped water and fat signal magnitudes;
   determining a second measure of fit map of the signal model based on the swapped water and fat signal magnitudes;
   determining a second overall measure of fit factor based on the second measure of fit map;
   identifying the water and fat signals by comparing the first and second overall measure of fit factors; and
   generating at least one water image and at least one fat image based on the water and fat signals;
   wherein the workstation communicates with the computer system to display the at least one water image and at least one fat image, so that a user interactively manipulates the at least one water image and at least one fat image and views the at least one water image and at least one fat image from various viewpoints and in various reading modes.

2. A computer-implemented method of identifying fat and water signals of an imaging system, wherein the imaging system includes a computer system, a radiology scanner and a workstation, and the computer system is connected to the radiology scanner and the workstation;
   wherein the workstation communicates with the computer system to display at least one water image and at least one fat image, so that a user interactively manipulates the at least one water image and at least one fat image and views the at least one water image and at least one fat image from various viewpoints and in various reading modes;
   the computer-implemented method comprising:
   quantifying the water and fat signals in image data acquired by the radiology scanner to generate measured water and fat signal values;
   determining a first measure of fit map of a signal model based on the measured water and fat signal values;
   swapping the measured water and fat signal values to generate swapped water and fat signal values;
   determining a second measure of fit map of the signal model based on the swapped water and fat signal values;
   identifying the water and fat signals based on the first and second measure of fit maps; and
   generating at least one water image and at least one fat image based on the water and fat signals.

3. The method of claim 2 wherein the image data comprises magnetic resonance (MR) image data.

4. The method of claim 2 wherein the signal model is determined based on an assumption that low flip angles are used to acquire the image data.

5. The method of claim 2 wherein the signal model is determined based on an assumption that the image data is acquired at two echo times.

6. The method of claim 2 wherein the signal model is determined based on an assumption that the image data is acquired at three or more echo times.

7. The method of claim 2 wherein the first and second measure of fit maps comprise first and second goodness of fit maps.

8. The method of claim 7 wherein the first and second goodness of fit maps are determined based on the following:

$$g = \frac{\left| |S_n| - \left| (\tilde{M}_w + c_n \tilde{M}_f) \right| \right|}{|S_n|}$$

wherein $S_n$ is signal value of the acquired MR signal, $c_n$ is a complex coefficient, and $\tilde{M}_w$ and $\tilde{M}_f$ are the measured water and fat signal values, respectively.

9. The method of claim 7 wherein the first goodness of fit map is determined by calculating normalized errors of expected values generated by the signal model and the measured water and fat signal values.

10. The method of claim 7 wherein the second goodness of fit map is determined by calculating normalized errors of expected values generated by the signal model and the swapped water and fat signal values.

11. The method of claim 7 further comprising:
   determining a first overall measure of fit factor based on the first goodness of fit map;
   determining a second overall measure of fit factor based on the second goodness of fit map; and
   identifying the water and fat signals by comparing the first and second overall measure of fit factors.

12. The method of claim 11 wherein determining the first overall measure of fit factor comprises summing pixel or voxel values of the first goodness of fit map.

13. The method of claim 11 wherein determining the second overall measure of fit factor comprises summing pixel or voxel values of the second goodness of fit map.

14. The method of claim 11 wherein identifying the water and fat signals comprises:
   identifying true water and fat signal values as the measured water and fat signal values in response to the first overall measure of fit factor being less than or equal to the second overall measure of fit factor, and
   identifying the true water and fat signal values as the swapped water and fat signal values in response to the first overall measure of fit factor being greater than the second overall measure of fit factor.

15. A system of identifying signal components, comprising:
   a computer system, a radiology scanner and a workstation, and the computer system is connected to the radiology scanner and the workstation, wherein the workstation communicates with the computer system to display at least one water image and at least one fat image, so that a user interactively manipulates the at least one water image and at least one fat image and views the at least one water image and at least one fat image from various viewpoints and in various reading modes,
   wherein the computer system further comprises a non-transitory memory device for storing computer-readable program code; and
   a processor in communication with the memory device, the processor being operative with the computer-readable program code to perform steps comprising:
      receiving multiple measured signal values corresponding to respective quantified signal components in image data acquired by the radiology scanner;
      determining at least one first measure of fit map of a signal model based on the measured signal values;
      swapping the measured signal values to generate swapped signal values;
      determining at least one second measure of fit map of the signal model based on the swapped signal values;
      identifying multiple signal components by comparing the first and second measure of fit maps; and
      generating at least two images based on the multiple signal components.

16. The system of claim 15 wherein the quantified signal components comprise at least one water signal component and at least one fat signal component.

17. The system of claim 15 wherein the image data comprises MR image data.

18. The system of claim 15 wherein the first and second measure of fit maps comprise first and second goodness of fit maps.

19. The system of claim 18 wherein the processor is operative with the computer-readable program code to perform further steps comprising:
   determining a first overall measure of fit factor based on the first goodness of fit map;
   determining a second overall measure of fit factor based on the second goodness of fit map; and
   identifying the multiple signal components by comparing the first and second overall measure of fit factors.

20. The system of claim 19 wherein the processor is operative with the computer-readable program code to identify the multiple signal components by identifying true signal values as the measured signal values in response to the first overall measure of fit factor being less than or equal to the second overall measure of fit factor; and identifying the true signal values as the swapped signal values in response to the first overall measure of fit factor being greater than the second overall measure of fit factor.

* * * * *